United States Patent
LaRocca et al.

(10) Patent No.: US 9,991,874 B1
(45) Date of Patent: Jun. 5, 2018

(54) 8GHZ-20GHZ NOISE CANCELLING TRANSVERSAL RECONFIGURABLE NOTCH FILTER

(71) Applicant: NORTHROP GRUMMAN SYSTEMS CORPORATION, Falls Church, VA (US)

(72) Inventors: Timothy R. LaRocca, Torrance, CA (US); Denpol Kultran, Torrance, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days. days.

(21) Appl. No.: 15/341,829

(22) Filed: Nov. 2, 2016

(51) Int. Cl.
  *H03H 11/04* (2006.01)
  *H03H 11/26* (2006.01)
  *H03H 11/32* (2006.01)

(52) U.S. Cl.
  CPC ......... *H03H 11/0427* (2013.01); *H03H 11/26* (2013.01); *H03H 11/32* (2013.01); *H03H 2011/0488* (2013.01)

(58) Field of Classification Search
  CPC ..... H03H 11/0427; H03H 11/26; H03H 11/32
  See application file for complete search history.

(56) References Cited

U.S. PATENT DOCUMENTS

| 5,051,709 A * | 9/1991 | Birkett | H03H 9/42 333/152 |
| 8,504,601 B2 * | 8/2013 | Mallinson | H03H 15/00 708/208 |

\* cited by examiner

*Primary Examiner* — Jeffrey Zweizig
(74) *Attorney, Agent, or Firm* — John A. Miller; Shumaker, Loop & Kendrick, LLP

(57) ABSTRACT

A tunable analog noise-cancelling transversal reconfigurable filter for filtering an RF signal. The filter includes a noise-cancelling balun responsive to the RF signal and providing gain and noise suppression, and a time delay network responsive to the signal from the balun. The time delay network includes a single continuous three-dimensional air coaxial line where a separate tap is provided between sections of the line. The filter also includes a multiplication and summing network having a plurality of multiplication stages, where each stage is fed by a voltage signal from at least one of the taps, and each stage includes a multiplication amplifier that amplifies the voltage signal. A tuning element provides a multiplication coefficient to the amplified signal. Each amplified signal in each stage is added on an output line, where the multiplication and summing network operates under Millman's Theorem.

16 Claims, 3 Drawing Sheets

8GHZ-20GHZ NOISE CANCELLING TRANSVERSAL RECONFIGURABLE NOTCH FILTER

GOVERNMENT CONTRACT

This invention was made with Government support under contract HR0011-15-C-0046 awarded by DARPA. The Government has certain rights in the invention.

BACKGROUND

Field

This invention relates generally to a high frequency tunable filter and, more particularly, to a high frequency noise-cancelling tunable transversal filter that employs a polystrata delay line network and a high frequency multiplication and summing network that provide tuning with minimal variations.

Discussion

Electronic data and communications systems typically employ RF filters, such as notch filters, bandpass filters, etc., that only pass RF signals in a particular frequency band of interest. In some applications, these filters are required to filter very high frequency signals, sometimes on the order of 20 GHz. Further, some of these types of filters are tunable filters that can change the frequency band that is being filtered.

There are two general types of RF filters employed for these purposes, namely, analog filters and digital filters. An analog filter employs analog electronic circuits having components, such as resistors, capacitors and amplifiers, to produce the desired filtering. One type of tunable analog filter employs a switching network that switches the signal to be filtered through different filtering components to get the different frequency filtering. However, in order to employ a switching network and all of the different filters that may be required for a certain application, the filter may be quite large and unsuitable. Other tunable analog filters employ, for example, tunable capacitors, that have a different frequency response in response to different voltages applied to the capacitors.

Since these types of RF analog filters are mechanical in nature, their tunable range, size, settings and types are often limited, and thus, state of the art tunable analog filters, especially for high frequencies, are limited in their ability to provide filtering over a wide frequency band. Also, known analog filters typically are limited in percentage bandwidth. Specifically, percentage bandwidth is fixed, and thus for a certain percentage bandwidth the range of frequencies that can be filtered at a particular center frequency is different than other center frequencies. For example, a tunable filter having a 10% bandwidth that is tuned to 20 GHz will have a 2 GHz bandwidth, but that same filter that is tuned to 2 GHz will only have a 200 MHz bandwidth. However, it is desirable to maintain the filtering bandwidth of the filter constant at different tuning frequencies.

Digital filters employ a digital processor that performs numerical calculations on sampled values of a signal to be filtered, where the analog input signal must first be digitized using an analog-to-digital converter (ADC). Digital filters offer the ability to be programmable where the filter can be tuned to different frequency ranges through software, whereas an analog filter can only be changed by changing the filter circuits. A digital filter can be a finite impulse response (FIR) filter whose impulse response has a finite duration, or an infinite impulse response (IIR) filter that may continue to respond indefinitely to the signal.

Digital filters typically do not suffer from the percent bandwidth problem discussed above for analog filters. However, digital filters can only filter relatively low frequency signals because of the limited speed of DSP technology. For high frequency applications, such as 20 GHz, those signals would need to be down-converted prior to filtering the signals to a speed that is suitable for digital signal processing techniques. This down converting process of the received signal passes noise and other signal artifacts that do not allow the high frequency signal to be effectively filtered at the baseband level.

DETAILED DESCRIPTION OF THE EMBODIMENTS

The following discussion of the embodiments of the invention directed to a high frequency noise-cancelling transversal reconfigurable filter is merely exemplary in nature, and is in no way intended to limit the invention or its applications or uses.

As will be discussed in detail below, the present invention proposes an agile high frequency analog noise-cancelling transversal reconfigurable filter that is extremely small in size. The transversal filter operates in a similar manner to a digital FIR filter, but with the digital components replaced by RF analog elements. The filter employs a wideband low-loss polystrata delay network instead of traditional D flip-flops to feed a novel high frequency multiplication and summing network. A noise-cancelling balun suppresses noise and drives the polystrata delay network. The filter has a flexible bandwidth, rejection, center frequency and shape/type that is commensurate with a digital FIR filter, has a small size compared to other tunable filter technologies, has insertion gain instead of loss, has non-reciprocal transfer characteristics, and has multiple selectable notches/passband responses.

Figure 1:
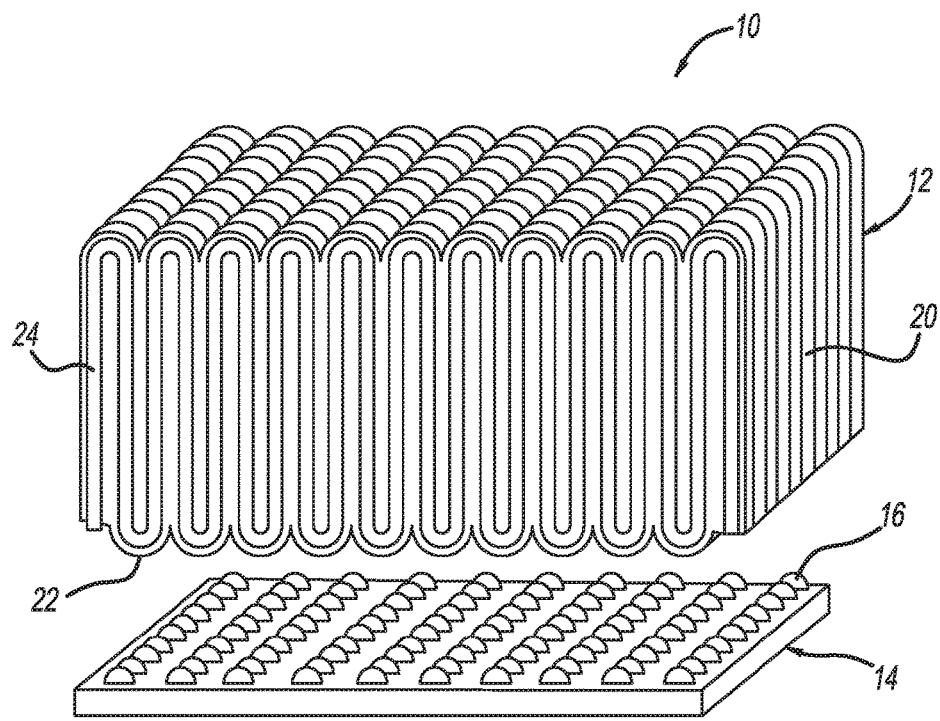
FIG. 1 is an exploded isometric view of a high frequency transversal reconfigurable filter.

FIG. 1 is an exploded isometric view of a high frequency noise-cancelling transversal reconfigurable filter 10 of the type referred to above. The filter 10 includes a signal delay network 12 that is electrically coupled to a circuit board 14 through a number of contact pads 16 so as to electrically couple various circuit elements in the board 14 to different taps in the delay network 12, as will be discussed in detail below. The circuit board 14 is shown separated from the delay network 12 merely for illustrative purposes. In one non-limiting embodiment, the circuit board 14 employs CMOS integrated circuit technologies. The delay network 12 includes a number of rows 20, where each row 20 includes a series of U-shaped sections 22. A single delay line 24 reciprocates back and forth along each row 20 through the U-shaped sections 22, and returns back along the next row 20. Each of the contact pads 16 is electrically coupled to the delay line 24 at a lower location of each of the U-shaped section 22 so that a certain delay time of the signal be filtered is tapped off of the delay line 24 at regular intervals and provided to the circuit elements in the circuit board 14, as will be further discussed below. In one non-limiting embodiment, the delay line 24 is a three-dimensional air coaxial line, such as a polystrata line, that includes a certain conductive material suspended in air by spaced apart dielectric posts (not shown) so that air is the surrounding dielectric medium to provide the desired miniaturization and frequency performance, where the conductive line is surrounded by a metallic ground plane. The number and length of the rows 20 is application specific depending on the number of taps desired for the frequency band of interest and the desired level of tuning. In one non-limiting embodiment, the filter 10 includes 121 tuning taps to provide a 9-bit filter that allows selection of one of twelve 2 GHz bands. In this non-limiting embodiment, the filter 10 is generally square and is about 5 mm in the X and Y direction and about 2.5 mm in the vertical Z direction.

Figure 2:
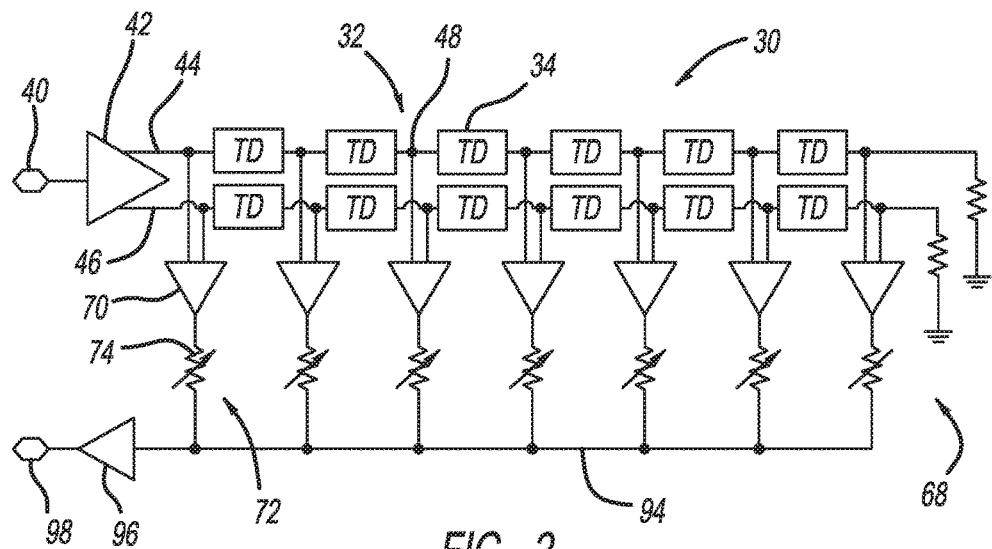
FIG. 2 is a schematic diagram of a high frequency differential transversal reconfigurable filter.

FIG. 2 is a schematic diagram of a filter 30 of the type that is embodied in the filter 10 discussed above. The filter 30 includes a delay network 32 having a number of time delay (TD) devices 34, where each device 34 is generally defined as a length of the delay line 24 between adjacent taps. All of the separate U-shaped sections 22 are not represented as the delay devices 34 in the filter 30 merely for clarification purposes. A signal to be filtered provided by, for example, an antenna (not shown) is received at node 40 and is sent to a noise-cancelling active balun 42. The signal is split into differential signals that are 90° apart in phase by the balun 42 and provided on lines 44 and 46 in the network 32 before being sent to the TD devices 34. In this embodiment, differential signals are required because the signal provided by the antenna is single ended. In this manner, the coefficients provided to the multipliers discussed below in the digital-type filter can have negative values.

Figure 3:
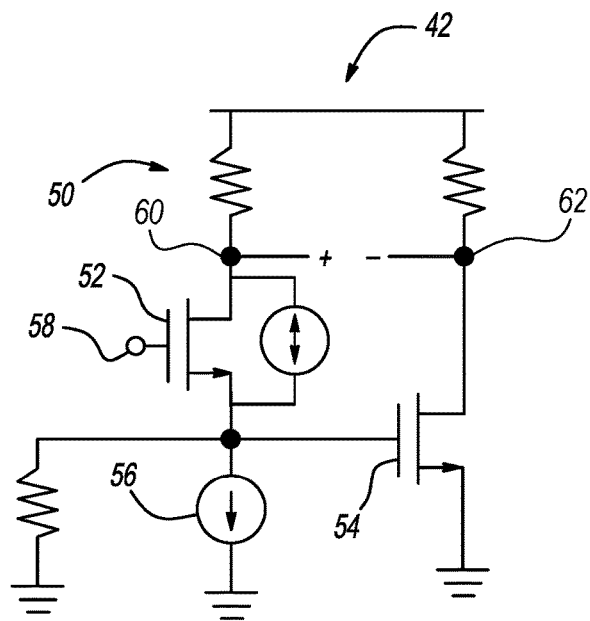
FIG. 3 is a schematic diagram of a noise-cancelling balun employed in the filter shown in FIG. 2.

The balun 42 can be any balun suitable for the purposes described herein that provides gain and suppresses noise. FIG. 3 is a schematic diagram of the balun 42 showing one acceptable and known design that includes a resistor divider network 50, FET switches 52 and 54, and a current source 56. The signal to be filtered is provided at node 58 and the differential signals provided on the lines 44 and 46 are provided at nodes 60 and 62.

The delayed differential signals are tapped off of the lines 44 and 46 at nodes 48 between the TD devices 34, as shown, and are provided as differential inputs to a number of amplification stages 72 in a multiplication and summing network 68. The delayed voltage signals from the nodes 48 are amplified by a buffer amplifier 70 and multiplied by a coefficient provided by a variable resistor 74, where the variable resistor 74 can be a plurality of parallel coupled FET resistors. The coefficient provided by the resistor 74 in each stage 72 selects the voltage signals from the nodes 48 to provide the selected tuning of the filter 30 in a manner well understood by those skilled in the art. The delayed voltages provided by the TD devices 34 are equivalent to voltage generators, where the coefficient multiplication is achieved with the conductance provided by resistors and transistors in the amplifier 70.

Figure 4:
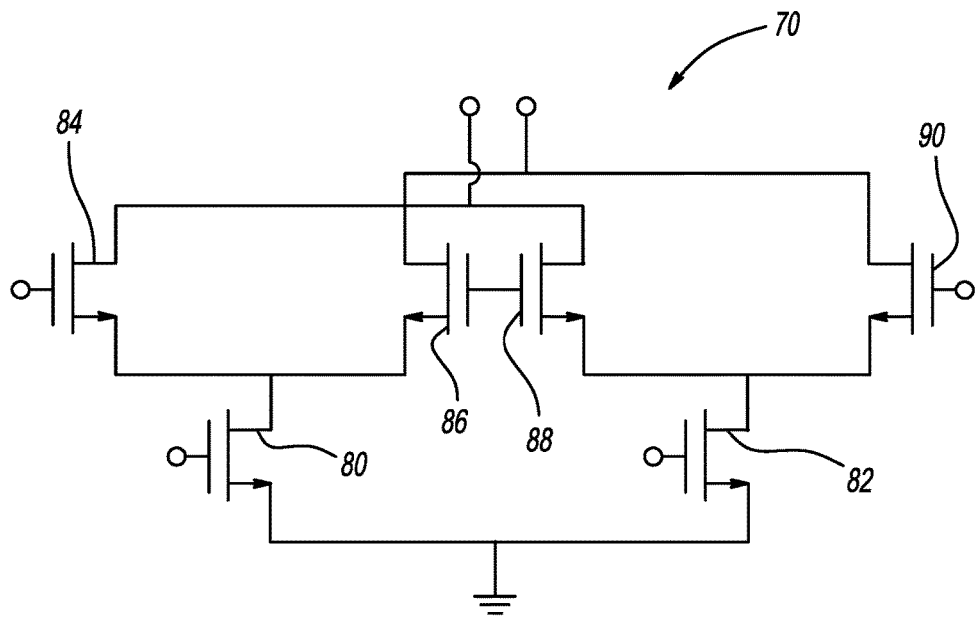
FIG. 4 is a schematic diagram of a Gilbert cell employed in the filter shown in FIG. 2.

Amplification of the signal by each amplifier 70 can be provided by any suitable circuitry, such as a Gilbert cell. FIG. 4 is a schematic diagram of the amplifier 70 showing this non-limiting design. The amplifier 70 includes a pair of FETs 80 and 82 that provide a transconductance circuit for phase alignment of the signal and FETs 84, 86, 88 and 90 that provide a transimpedance amplifier (TIA) to provide the multiplication of the signal by the coefficient.

The multiplied signals from each stage 72 are added together on line 94 to provide the summing operation to obtain the filtering. This described multiplication and summing operation of the delayed signals uses Millman's Theorem, sometimes referred to as the parallel generator theorem, to provide a transversal filter transfer function that allows a number of parallel voltage sources to be reduced to one equivalent source. As is known in the art, Millman's Theorem can be used to compute the voltage at the ends of a circuit made of only branches in parallel. The summed value on the line 94 is then sent to a buffer 96, which can be a fixed gain or variable gain buffer, before the filtered signal is output at node 98.

Figure 5:
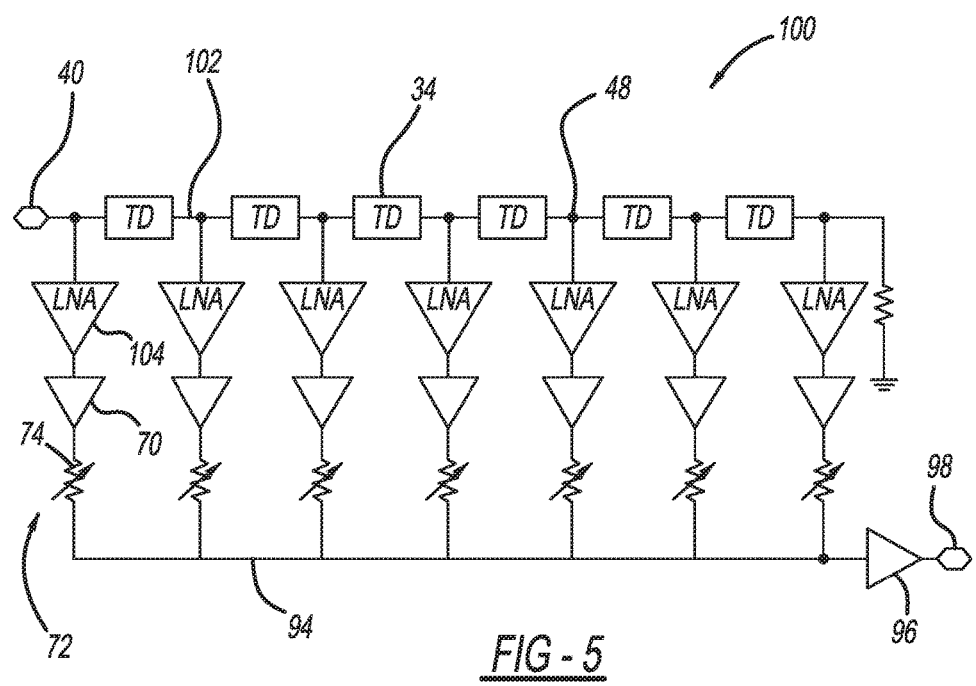
FIG. 5 is a schematic diagram of a high frequency single ended transversal reconfigurable filter.

As discussed above, the filter 30 operates on differential signals. In an alternate embodiment that operates on the same principle employing Millman's Theorem as discussed above, the filter can be configured as a single-ended filter, where the negative coefficients are provided by a negative coefficient low noise amplifier (LNA). This embodiment is shown in FIG. 5 as filter 100, where like elements to the filter 30 are identified by the same reference number. In this embodiment, the antenna signal at the node 40 is not provided to the balun 42, but is provided to a single line 102 on which are distributed the TD devices 34. The tapped signals at the nodes 48 between the devices 34 are sent to a noise-cancelling LNA 104 in each stage 72 that provides the negative coefficient signal when desired before being sent to the amplifier 70.

Figure 6:
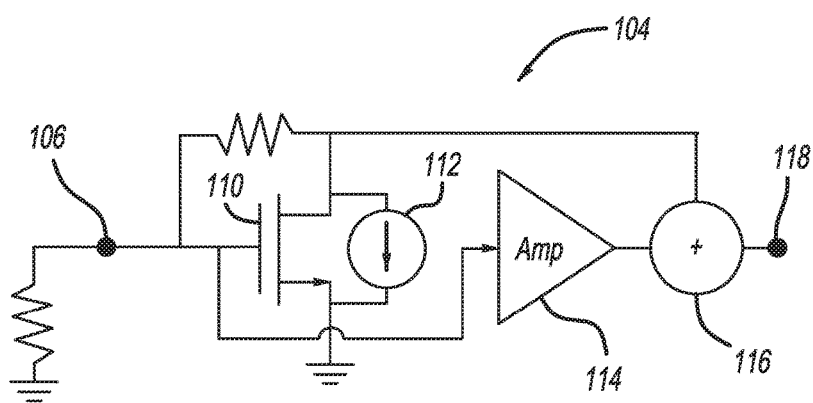
FIG. 6 is a schematic diagram of a noise-cancelling low noise amplifier (LNA) employed in the filter shown in FIG. 5.

The LNA 104 can be any LNA suitable for the purposes discussed herein. FIG. 6 is a schematic diagram of the LNA 104 showing one non-limiting example. Signals from the nodes 48 are provided at node 106 which are switched at the frequency band of interest by an FET switch 110 to switch in a current source 112, where the signal is amplified by an amplifier 114. The input signal at the node 106 and the amplified signal from the amplifier 114 are then added together by a summer 116 to provide the signal to the amplifier 70 at node 118.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:
1. A tunable analog filter comprising:
   a time delay network responsive to an input signal to be filtered, said time delay network including a plurality of delay devices where a separate delay tap is provided between the devices; and
   a multiplication and summing network including a plurality of multiplication stages, each stage being fed by a differential voltage signal from two of the taps, each stage including a multiplication amplifier that amplifies the voltage signal and a tuning element, said tuning element providing a multiplication coefficient for the amplifier that is multiplied by the amplified voltage signal, each amplified and multiplied signal in each stage being added on an output line.

2. The filter according to claim 1 wherein the multiplication and summing network operates under Millman's Theorem.

3. The filter according to claim 1 wherein each multiplication amplifier is a Gilbert cell.

4. The filter according to claim 1 wherein the multiplication and summing network is configured in CMOS technology.

5. The filter according to claim 1 further comprising a noise-cancelling balun that receives the input signal and provides gain and noise suppression before the signal is provided to the time delay network.

6. The filter according to claim 1 wherein the tuning element is a network of programmable FET resistors.

7. The filter according to claim 1 wherein the filter is a 121 tap, 9-bit filter.

8. The filter according to claim 1 wherein the filter operates in the 8-20 GHz range.

9. A tunable analog filter for filtering an RF signal, said filter comprising:
- a noise-cancelling balun responsive to the RF signal and providing gain and noise suppression;
- a time delay network responsive to the signal from the balun, said time delay network including a single continuous three-dimensional air coaxial line where a separate delay tap is provided between sections of the coaxial line; and
- a multiplication and summing network including a plurality of multiplication stages, each stage being fed by a voltage signal from at least one of the taps, each stage including a multiplication amplifier that amplifies the voltage signal and a tuning element, said tuning element providing a multiplication coefficient for the amplified signal that is multiplied by the voltage signal, each amplified and multiplied signal in each stage being added on an output line, wherein the multiplication and summing network operates under Millman's Theorem.

10. The filter according to claim 9 wherein the coaxial line is a polystrata line.

11. The filter according to claim 9 wherein the time delay network includes rows through which the delay line meanders.

12. The filter according to claim 9 wherein each multiplication amplifier is a Gilbert cell.

13. The filter according to claim 9 wherein the multiplication and summing network is configured in CMOS technology.

14. The filter according to claim 9 wherein the tuning element is a network of programmable FET resistors.

15. A tunable analog filter comprising a multiplication and summing network including a plurality of multiplication stages, each stage being fed by a voltage signal from at least one tap of a time delay network responsive to an input signal, each stage including a Gilbert cell multiplication amplifier that amplifies the voltage signal and a tuning element, said tuning element providing a multiplication coefficient for the amplified signal that is multiplied by the voltage signal, each amplified and multiplied signal in each stage being added on an output line, wherein the multiplication and summing network operates under Millman's Theorem.

16. A tunable analog filter comprising:
- a time delay network responsive to an input signal to be filtered, said time delay network including a plurality of delay devices where a separate delay tap is provided between the devices; and
- a multiplication and summing network including a plurality of multiplication stages, each stage being fed by a voltage signal from at least one of the taps, each stage including a multiplication amplifier that amplifies the voltage signal and a tuning element, said tuning element being a network of programmable FET resistors providing a multiplication coefficient for the amplifier that is multiplied by the amplified voltage signal, each amplified and multiplied signal in each stage being added on an output line.

* * * * *